United States Patent [19]

Hanak

[11] Patent Number: 4,481,230

[45] Date of Patent: Nov. 6, 1984

[54] METHOD OF DEPOSITING A SEMICONDUCTOR LAYER FROM A GLOW DISCHARGE

[75] Inventor: Joseph J. Hanak, Lawrence Township, Mercer County, N.J.

[73] Assignee: RCA Corporation, New York, N.Y.

[21] Appl. No.: 546,047

[22] Filed: Oct. 27, 1983

[51] Int. Cl.³ .............................................. B05D 3/02
[52] U.S. Cl. ........................................ 427/39; 427/84; 427/86; 427/88; 427/95; 427/264
[58] Field of Search .................. 427/39, 84, 86, 88, 427/95, 264

[56] References Cited

U.S. PATENT DOCUMENTS 4,064,521  12/1977  Carlson .................................... 357/2
4,315,096   2/1982  Tyan ..................................... 136/244

OTHER PUBLICATIONS

G. Francis, "the Glow Discharge at Low Pressures," Encyclopedia of Physics, vol. 22, pp. 53–203 (1956), (Springer Verlag, Berlin).

Matsumura et al., "Large-area Deposition of Amorphous-Silicon," Journal de Physique 10, C4-671 (1981).
Uchida et al., "Arc Discharge Produced Amorphous Silicon Solar-Cells," 3d Photovoltaic Sci. and Engr. Conf. in Japan, 1982, p. 85.

Primary Examiner—Bernard D. Pianalto
Attorney, Agent, or Firm—Birgit E. Morris; Donald S. Cohen; William J. Burke

[57] ABSTRACT

An improved method for the deposition of a semiconductor layer from the positive column of a glow discharge is disclosed. The improvement comprises dividing an electrically conducting layer on a surface of an insulator into a plurality of electrically isolated segments. The width of each segment is preferably less than or equal to the maximum allowable difference in the relative plasma potential over the conducting substrate divided by the plasma potential gradient. Data for amorphous silicon photovoltaic devices are also disclosed which show a greatly improved uniformity in $V_{oc}$ and $J_{sc}$ with relative position in the positive column for segmented as compared to unsegmented devices.

10 Claims, 5 Drawing Figures

METHOD OF DEPOSITING A SEMICONDUCTOR LAYER FROM A GLOW DISCHARGE

The invention is a method of depositing a semiconductor layer, in particular a layer including amorphous silicon, onto a substrate from the positive column of a glow discharge.

BACKGROUND OF THE INVENTION

Carlson, in U.S. Pat. No. 4,064,521, incorporated herein by reference, has disclosed the fabrication of semiconductor devices incorporating hydrogenated amorphous silicon (a-Si:H) deposited onto a substrate from a glow discharge. Typically these films are deposited on a substrate positioned in the cathodic or anodic dark region of the discharge. While excellent photovoltaic devices have been fabricated, the area of the devices which can be fabricated and the throughput rate in the deposition apparatus are limited. Recently useful photovoltaic devices which include a-Si:H have been fabricated with a high production rate for the a-Si:H layer by positioning the substrate in the positive column of the glow discharge. The production rate is higher since, although the deposition rate is low due to the small electric field, the volume of the discharge in which deposition can occur is much larger.

During the deposition of a layer from the glow discharge, the growing film, enveloped in the discharge, may be subject to bombardment by electrons, ions and energetic neutrals. Such bombardment has been shown to have profound effects on the properties of an a-Si:H film including the growth rate, film structure, composition, and purity content, density of defects and optical transport properties.

I have found that during the deposition of a-Si:H in the positive column a plasma potential gradient develops relative to a conductive substrate on which the layer is deposited when the plane of the conductive substrate is oriented parallel to the positive column. This relative plasma potential ranges from small negative to high positive values and its magnitude varies approximately linearly with the substrate length. This plasma potential variation is determined by the electric field, E, which exists in the positive column and which is of the order of 1-10 volts per centimeter. When the plasma potential relative to the substrate is low ($-5$ to $10$ volts) during the deposition of the a-Si:H layer, the resulting film shows a near maximum photovoltaic performance. As this plasma potential increases progressively outside of this range for either voltage polarity, nonuniformities in film thickness along the substrate and a drastic decrease in the photovoltaic performance result.

Deposition of the semiconductor material in the positive column of the glow discharge offers the potential of large economies in the manufacturing process. Thus it would be desirable to improve the deposition method to compensate for eliminating these deficiencies in the positive column method while retaining its advantage of high throughput.

SUMMARY OF THE INVENTION

The invention is a method for improving the thickness uniformity and photovoltaic properties of a semiconductor layer deposited by decomposition of a feedstock gas from the positive column of a glow discharge. The method includes the steps of forming an electrically conductive layer on the surface of a substrate, dividing this conducting layer into a plurality of substantially parallel, electrically isolated segments and then positioning the substrate with the segmented conducting layer thereon in the positive column of a glow discharge with the plane of the conducting layer oriented parallel to the axis of the positive column and the axes of the dividers between the segments of the electrically conducting layer oriented substantially perpendicular to the axis of the positive column.

DETAILED DESCRIPTION OF PREFERRED EMBODIMENTS

Figure 1:
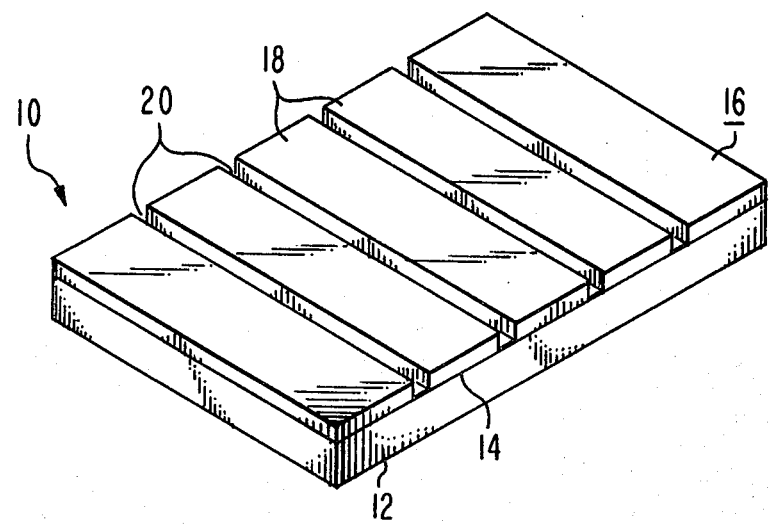
FIGS. 1 and 2 are perspective views of two different substrates used in the practice of the invention.

A substrate 10 useful for the deposition of a semiconductor layer thereon in the practice of the method of the invention is shown in FIG. 1. The substrate 10 includes an electrical insulator 12 having a major surface 14. An electrically conducting layer 16 overlies the major surface 14 and is divided into electrically isolated segments 18 by first dividers 20.

Figure 2:
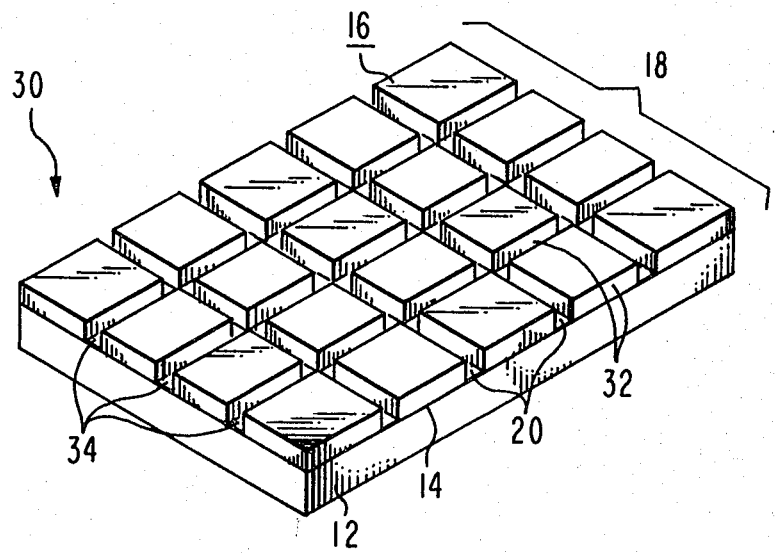
Figure 3:
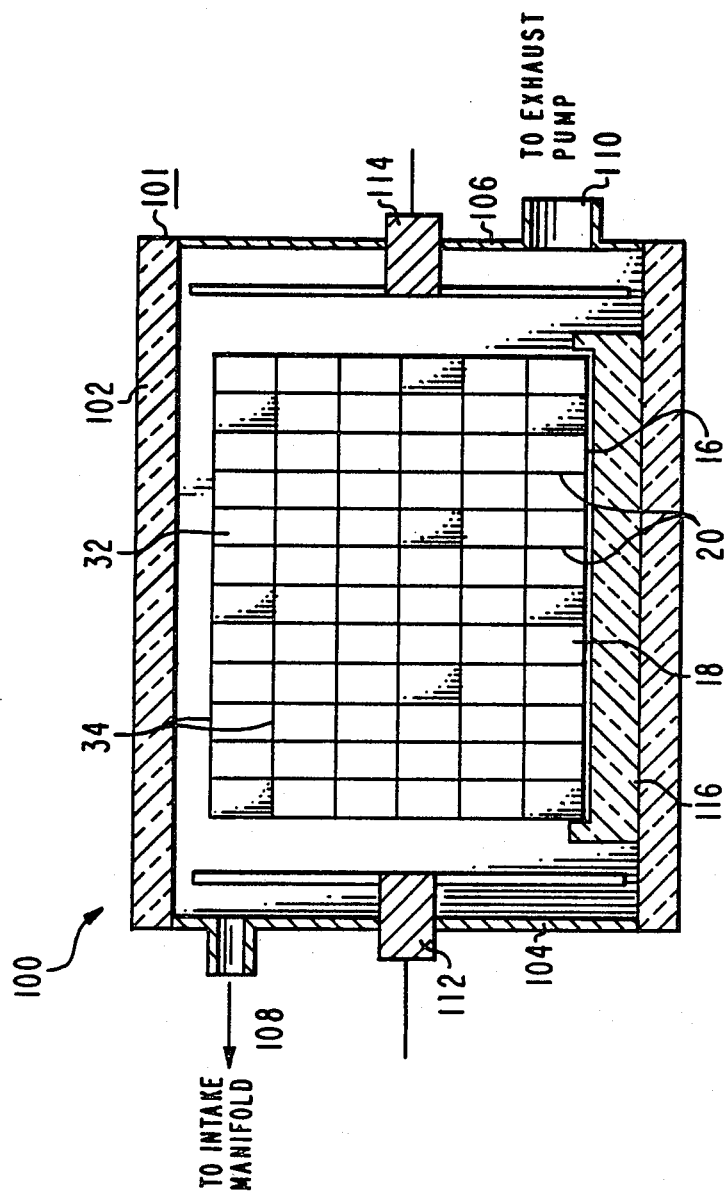
FIG. 3 is a cross-sectional view of deposition apparatus used in the practice of the invention.

In FIGS. 2 and 3 elements corresponding to those of FIG. 1 have the same numerical identification.

In FIG. 2 the substrate 30 differs from the substrate 10 of FIG. 1 in that the segments 18 of the electrically conducting layer 16 are further divided into sub-segments 32 separated from one another by second dividers 34.

The electrical insulator 12 is typically composed of a dielectric material, such as glass, which is substantially transparent in the wavelength range between 400 and 1,000 nanometers (nm). The insulator should have sufficient mechanical strength to support the structure deposited thereon.

The electrically conducting layer 16 is typically composed of a material which is also substantially transparent in the wavelength range between about 400 and 1,000 nm, such as $SnO_2$ doped with fluorine or antimony. This material may be deposited by vacuum evaporation, spraying or chemical vapor deposition techniques well known in the art.

The first and second dividers 20 and 34, respectively, may be formed by well-known means such as grinding, etching, mechanical scribing or laser ablation. The dividers preferably extend completely through the electrically conducting layer 16 thereby forming an air gap so that the individual segments are electrically insulated from one another. The axis of a divider is defined as the direction in the plane of the electrically conducting layer and coincident with the longest dimension of the divider.

The method of the invention may be practiced using a plasma reactor 100 as shown in FIG. 3. The reactor 100 includes a chamber 101 which comprises a side wall 102, typically configured as a cylinder, with end walls 104 and 106 to form a vacuum-tight container. An intake port 108 extends through the wall 104 and is connected external to the chamber 101 to an intake manifold which is not shown. Intake manifolds are well known in the art and typically comprise an arrangement of gas-storage vessels, valves and mixing chambers by means of which the proper proportions and flow rates of the gases into the chamber 101 are established. An exhaust port 110 extends through the opposed end wall 106 and is connected to an exhaust system, typically a rotary pump used in combination with a turbo-molecular pump. Electrodes 112 and 114 are mounted on and extend through the end walls 104 and 106, respectively, and are typically electrically isolated from the end walls. A support 116 for the substrate 12 is positioned in that part of the chamber 101 where the positive column will be located. The support 116 is such that the substrate 12 with the electrically conducting layer 16 thereon is electrically floating, i.e., is electrically isolated from the remainder of the reactor 100.

In the operation of the plasma reactor 100 the chamber 101 is evacuated through exhaust port 110 and the desired gas mixture is admitted through intake port 108. A discharge is then struck by applying an appropriate voltage between the electrodes 112 and 114. The electrical discharge interacts with the feed-stock gas mixture to produce molecular or atomic species which can deposit on the walls, electrodes or other articles present within the chamber 101. Preferably the system is operated in a flowing gas mode to ensure the presence of a relatively constant concentration of the feed-stock gas mixture within the chamber 101. The balance between the flow rate of the gas mixture into the chamber 101 and the exhaust rate establishes the operating pressure in the chamber. This pressure is typically between about 0.1 and 5 Torr.

While the plasma reactor has been described with reference to FIG. 3, it is to be understood that other types of reactors and electrode arrangements, such as that disclosed by Hanak in U.S. patent application Ser. No. 469,723, filed Feb. 25, 1983, may also be used.

The glow discharge in the chamber typically comprises a cathode dark space adjacent to the cathode with one or more cathode or negative glow layers interspersed with additional dark spaces adjacent to the cathode dark region and extending a small distance along the axis of the discharge from the cathode. The Faraday dark space, typically having a length comparable to the cathode dark space and negative glow regions, extends a further distance along the axis from the cathode. The positive column extends a further distance along the axis from the Faraday space and, depending upon the applied voltage and inter-electrode spacing, typically extends over a large fraction of the space between the electrodes. The last significant part of the discharge is the anode dark space which is adjacent to the anode. The article of Francis entitled "Glow Discharge at Low Pressures" in Vol. 22, pp. 53–208, of the Encyclopaedia of Physics published by Springer-Verlag (Berlin 1956) provides a detailed discussion of the properties of these discharges. The electric field in the discharge is highest at the cathode, decreases rapidly in the cathode dark space to a low value in the negative glow and Faraday dark spaces and then rises to an intermediate, relatively constant value in the positive column.

The extent of the positive column along the axis of the discharge depends upon the inter-electrode spacing. Thus, if the electrode spacing is small then the length of the positive column will also be small. For the deposition of the material onto a substrate positioned near the cathode with its surface perpendicular to the cathode, the positive column is not of interest and the electrode spacing is typically kept small, between about 2 and 10 cm. This arrangement is also useful since it reduces the voltage and thus the power requirements for the discharge. For a discharge in which the positive column is used for deposition, the electrode spacing is much greater, typically 50 cm or greater.

For a variety of different feed-stock gases there exists a potential difference (relative plasma potential) between the positive column and an electrically conductive layer on an insulating substrate. The magnitude of the relative plasma potential varies with the gas used and the substrate length but its essential character remains the same. The relative plasma potential was measured for a 28 cm long conductive layer to be between about $-5$ and $-20$ volts on the end of the film nearest the cathode and between about $+30$ and $+100$ volts on the end of the layer nearest the anode and varies linearly with position. The magnitude of this relative plasma potential depends upon the gas species and its pressure, the layer length and the chamber geometry, as discussed by Francis. Thus the portion of deposited film nearest the cathode will be bombarded with electrons or negative ions while the other end will be bombarded with positive ions. This variation in the relative plasma potential means that the conducting layer can become more positive than the surrounding glow discharge. This is most likely due to the fact that the potential on the conducting layer has nearly a constant value due to its high conductivity, while the potential in the plasma varies linearly along the length of a layer due to the relatively high resistance of the glow discharge.

The substrate 10 or 30 upon which the semiconductor layer is to be deposited is positioned in the positive column of the glow discharge with the plane of the electrically conducting layer 16 substantially parallel to the axis of the positive column with the first dividers 20 oriented with their axes substantially perpendicular to the axis of the positive column. The substrate 10 or 30 is typically mounted on the electrically insulating support 116. The second dividers 34, if present, are then oriented with their axes substantially parallel to the axis of the positive column of the discharge. The positioning of the substrate 10 or 30 within the chamber 101 may occur either prior to the ignition of the discharge or after ignition by a moving system such as a belt or conveyor which can continually introduce different substrates into the discharge. It is to be understood that more than one substrate can be positioned in the chamber in this manner. Preferably the substrates are oriented back-to-back with their electrically conducting layers facing outwards.

Figure 4:
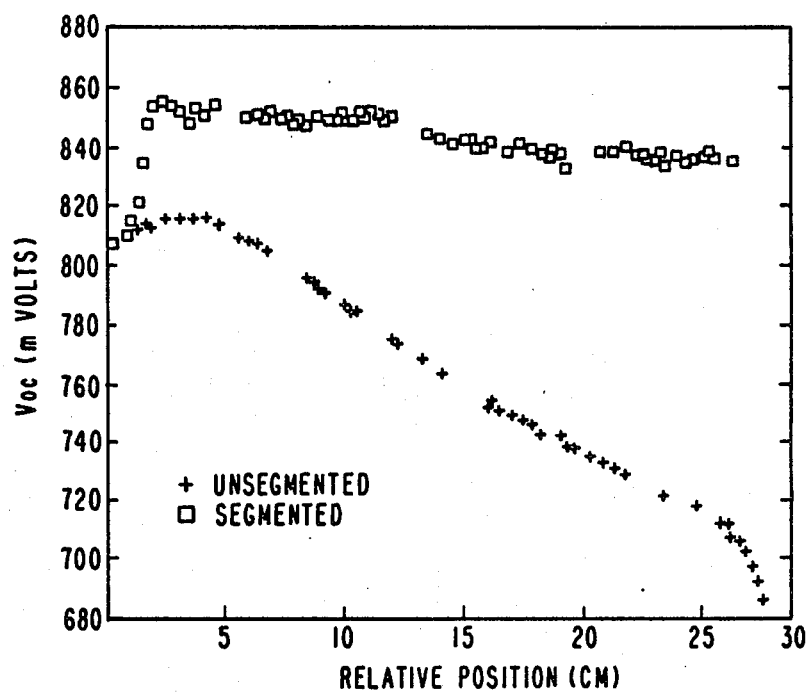
FIGS. 4 and 5 are graphical illustrations of the comparative variation in the open circuit voltage $V_{oc}$ and the short circuit current $J_{sc}$, respectively, for photovoltaic devices fabricated according to the prior art method and the method of the invention.
Figure 5:
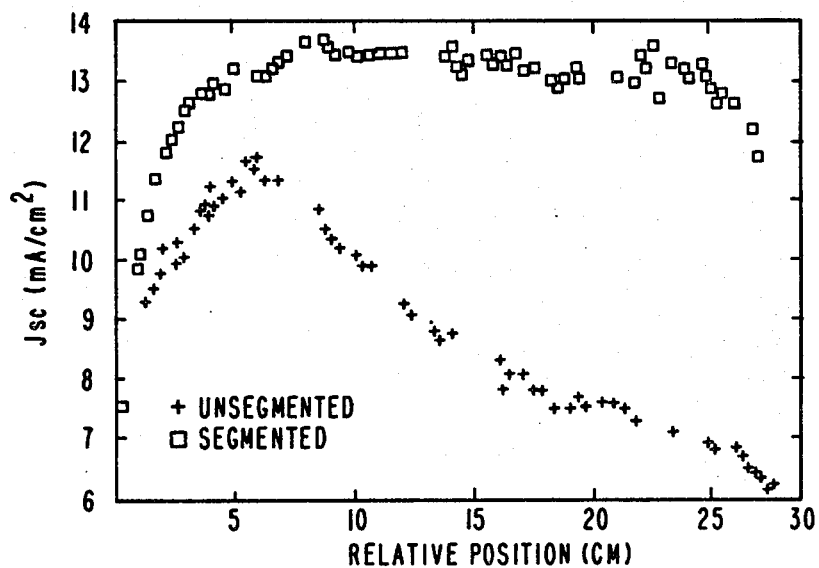

I have found that by dividing the electrically conducting layer into a plurality of segments extending perpendicular to the axis of the positive column the performance of photovoltaic devices fabricated by deposition from the positive column can be significantly improved. The variation of the open circuit voltage $V_{oc}$ and the short circuit current $J_{sc}$ for a substrate having an unsegmented electrically conducting layer and a second substrate having a segmented electrically conducting layer are illustrated in FIGS. 4 and 5, respectively. In each case 28 centimeter (cm) long by 7.5 cm wide glass substrates coated with a layer of indium-tin oxide and a 10 nm thick coating of a Pt-SiO$_2$ cermet were used for the deposition of the a-Si layer. For the deposition of a-Si:H, the flow rate of monosilane was 30 sccm and the flow of hydrogen was 2 sccm. The pressure in the reactor was 130 milliTorr, the deposition temperature was 250° C., and the glow discharge current was 20 milliamperes. The electrically conducting layer was segmented by laser-scribing into 0.5 cm wide strips electrically isolated from one another. The fabricated devices included an intrinsic layer having a thickness between about 500 and 600 nm and an N-type conductivity layer 35 nm thick doped by adding phosphine to the discharge. Layers of titanium and aluminum were sequentially deposited over the a-Si:H to provide a back electrical contact to the devices. These metal films were etched photolithographically to form arrays of square electrodes having an area of 0.052 cm² over both the segmented and unsegmented substrates.

The fabricated photovoltaic devices were Schottky barrier devices typically having a $V_{oc}$ between about 300 and 400 millivolts. The measured values of $V_{oc}$ and $J_{sc}$ are invariably lower than in corresponding devices having a P-type layer to form a P-I-N device. By applying an external reverse bias $V_{oc}$ is "augmented" to a range of about 800 millivolts which is typical of P-I-N devices. This procedure has the effect of approximately linearly increasing $J_{sc}$ and the device efficiency to levels found in P-I-N devices. Thus the bias is used in place of a P-type conductivity layer to provide results for comparison purposes with P-I-N devices which in turn helps to isolate and evaluate the quality of the deposited I-type layer. The effect of the bias voltages is to change the relative ordinate scales but not to change the relative values of these quantities with position on the substrate.

In FIGS. 4 and 5 $V_{oc}$ and $J_{sc}$ are plotted as a function of relative position in the plasma for these devices under 0.3 AM1 illumination. The relative position is measured from the end of the electrically conducting layer closest to the anode. For the unsegmented cell a bias of 0.429 volts was used and for the segmented cell a bias of 0.490 volts was used. It is seen that the $V_{oc}$ and $J_{sc}$ for devices having a segmented electrically conducting layer are much more uniform with position than for the devices having the unsegmented electrically conducting layer.

The maximum width of the segments $L_s$ between the dividers is less than or equal to $\Delta V/X_s$ where $\Delta V$ is the maximum allowable difference in the relative plasma potential and $X_s$ is the plasma potential gradient along the axis of the positive column. I have determined by measurements on amorphous silicon layers deposited on an electrically conducting layer on an insulating substrate in the positive column of a discharge that acceptable photovoltaic properties are obtained for $\Delta V$ having a value of 15 volts or less. The value of $X_s$ varies with the gas species and pressure and the chamber geometry, as discussed by Francis, and can be determined experimentally by inserting a moveable electrical probe into the positive column of the plasma and measuring the potential along the length of the positive column, relative to another electrode located at a fixed position in the column. $X_s$ has been determined to be about 3.9 V/cm for $SiH_4$ at a pressure 0.145 Torr in a 10 cm diameter chamber, about 1.2 meters long with the discharge confined along its length between two substrate plates 7.5 cm wide and 3.6 cm apart. These values give an $L_s$ less than or equal to 3.85 cm. Typically $L_s$ is between about 0.25 and 1.5 cm and preferably about 0.5 cm.

A plasma potential gradient may exist in the direction perpendicular to the axis of the positive column due to plasma inhomogeneities. If such a gradient exists, then the principles disclosed herein are equally applicable to this direction. In this case it would be useful to further subdivide the segments into sub-segments separated by subdividers substantially perpendicular to the dividers with the width $L_{ss}$ between subdividers being less than or equal to $\Delta V/X_{ss}$ where $X_{ss}$ is the plasma potential gradient in the direction perpendicular to the axis of the positive column and in the plane of the electrically conducting layer. $\Delta V$ has the same value as discussed above in the case for the gradient parallel to the axis of the positive column and $X_{ss}$ must be determined experimentally for the given configuration of the chamber and for the gas present in the chamber.

I claim:

1. In a method of depositing a layer of an amorphous semiconductor material from a gas in the positive column of a glow discharge, which method comprises the steps of:

depositing an electrically conducting layer onto a surface of an insulating substrate; and positioning the substrate in a chamber of a plasma reactor with the plane of the electrically conducting layer substantially parallel to the axis of the positive column;

the improvement comprising:

subdividing the electrically conducting layer into a plurality of electrically isolated segments with dividers therebetween; and positioning the substrate with the segmented electrically conducting layer in the chamber with the plane of said conducting layer substantially parallel to the axis of the positive column and the axes of the dividers between segments substantially perpendicular to the axis of the positive column.

2. The method of claim 1 wherein the width of the segments between dividers is less than or equal to the maximum allowable difference in the relative plasma potential over the electrically conducting layer along the axis of the positive column divided by the plasma potential gradient along the axis of the positive column.

3. The method of claim 2 where said maximum allowable difference is about 15 volts.

4. The method of claim 3 wherein the width of the segments is less than or equal to about 3.85 cm.

5. The method of claim 4 wherein the width of the segments is between about 0.25 and 1.5 cm.

6. The method of claim 5 wherein the width of the segments is about 0.5 cm.

7. The method of claim 2 further comprising the step of subdividing each of said segments into sub-segments wherein the sub-divisions between sub-segments are substantially perpendicular to the divisions between the segments.

8. The method of claim 7 wherein the width of the sub-segments between the sub-divisions is less than or equal to the maximum allowable difference in plasma potential over the electrically conducting layer perpendicular to the axis of the positive column divided by the plasma potential gradient perpendicular to the axis of the positive column.

9. The method of claim 2 wherein the gas includes a silane gas.

10. The method of claim 1 wherein the substrate is so positioned that it is electrically isolated from the remainder of the reactor.

* * * * *